United States Patent
Chen et al.

(10) Patent No.: US 12,256,533 B2
(45) Date of Patent: Mar. 18, 2025

(54) SEMICONDUCTOR MEMORY DEVICE AND METHOD OF FABRICATING THE SAME

(71) Applicant: Fujian Jinhua Integrated Circuit Co., Ltd., Quanzhou (CN)

(72) Inventors: Ken-Li Chen, Quanzhou (CN); Yifei Yan, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/427,852

(22) Filed: Jan. 31, 2024

(65) Prior Publication Data

US 2024/0244824 A1     Jul. 18, 2024

Related U.S. Application Data

(63) Continuation of application No. 17/573,597, filed on Jan. 11, 2022, now Pat. No. 11,930,631.

(30) Foreign Application Priority Data

Nov. 10, 2021  (CN) .......................... 202111327962.4
Nov. 10, 2021  (CN) .......................... 202122747174.2

(51) Int. Cl.
  *H10B 12/00*     (2023.01)
  *H10D 62/10*     (2025.01)

(52) U.S. Cl.
  CPC ....... *H10B 12/315* (2023.02); *H10B 12/0335* (2023.02); *H10B 12/482* (2023.02); *H10D 62/115* (2025.01)

(58) Field of Classification Search
  CPC ............. H10B 12/315; H10B 12/0335; H10B 12/482; H10B 12/053; H10B 12/485; H10D 62/115; H01L 21/764
  See application file for complete search history.

(56) References Cited

U.S. PATENT DOCUMENTS

| | | | |
|---|---|---|---|
| 9,318,379 B2 * | 4/2016 | Lee | H01L 21/764 |
| 9,425,200 B2 | 8/2016 | Hwang | |
| 10,141,200 B2 * | 11/2018 | Byun | H01L 21/823475 |
| 10,490,444 B2 | 11/2019 | Choi | |
| 11,665,883 B2 | 5/2023 | Heo | |
| 11,737,256 B2 * | 8/2023 | Lee | H10B 12/315 |
| | | | 257/296 |

(Continued)

*Primary Examiner* — Dao H Nguyen
(74) *Attorney, Agent, or Firm* — Winston Hsu

(57) ABSTRACT

The present disclosure relates to a semiconductor memory device and a fabricating method thereof, and the semiconductor memory device includes a substrate, bit lines, plugs and a spacer structure. The bit lines are separately disposed on the substrate, and the plugs are also disposed on the substrate to alternately arrange with the bit lines. The spacer structure is disposed on the substrate, between each of the bit lines and each of the plugs. The spacer structure includes a first air gap layer, a first spacer and a second air gap layer, and the first air gap layer, the first spacer and the second air gap layer are sequentially stacked between sidewalls of the bit lines and the plugs. Therefore, two air gap layers may be formed between the bit lines and the storage node contacts to improve the delay between the resistor and the capacitor.

20 Claims, 10 Drawing Sheets

(56) References Cited

U.S. PATENT DOCUMENTS

| | | | |
|---|---|---|---|
| 2015/0061134 A1* | 3/2015 | Lee | H10B 12/34 |
| | | | 257/751 |
| 2016/0027727 A1 | 1/2016 | Kim | |
| 2016/0247711 A1 | 8/2016 | Kim | |
| 2021/0210493 A1* | 7/2021 | Kim | H01L 21/764 |
| 2022/0139921 A1* | 5/2022 | Kim | H10B 12/315 |
| | | | 257/532 |
| 2022/0173107 A1* | 6/2022 | Moon | H10B 12/033 |

* cited by examiner

SEMICONDUCTOR MEMORY DEVICE AND METHOD OF FABRICATING THE SAME

CROSS REFERENCE TO RELATED APPLICATIONS

This application is a continuation application of U.S. application Ser. No. 17/573,597, filed on Jan. 11, 2022. The content of the application is incorporated herein by reference.

BACKGROUND OF THE INVENTION

1. Field of the Invention

The present invention relates to a semiconductor memory device and the method for fabricating the same, in particular to a semiconductor memory device having air gap and the method for fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a semiconductor memory device, in which two air gap layers are formed between the bit lines and the storage node contacts, so as to effectively improve the delay between the resistor and the capacitor.

One of the objectives of the present disclosure provides a method of fabricating a semiconductor memory device, in which the storage node pads are used as a mask to remove the material layers formed between the bit lines and the storage node contacts, thereby forming two air gap layers between the bit lines and the storage node contacts. Through these performances, the present disclosure enables to form a bi-layered air gap between each of the bit lines and each of the storage node contacts under a simplified process flow, and the possible delay between the resistor and the capacitor of the device may also be improved thereby.

To achieve the purpose described above, one embodiment of the present disclosure provides a semiconductor memory device including a substrate, a plurality of bit lines, a plurality of plugs, and a spacer structure. The bit lines are separately disposed on the substrate, and the plugs are disposed on the substrate, with the plugs and the bit lines being alternately arranged with each other. The spacer structure is disposed on the substrate between each of the bit lines and each of the plugs, wherein the spacer structure includes a first air gap layer, a first spacer and a second air gap layer, and the first air gap layer, the first spacer and the second air gap layer are sequentially stacked between sidewalls of the bit lines and the plugs.

To achieve the purpose described above, one embodiment of the present disclosure provides a method of fabricating a semiconductor memory device including the following steps. Firstly, a substrate is provided, and a plurality of bit lines is separately disposed on the substrate. Then, a plurality of plugs is formed on the substrate, with the bit lines and the plugs being alternately arranged with each other. Next, a spacer structure is formed on the substrate, between each of the bit lines and each of the plugs, wherein the spacer structure includes a first air gap layer, a first spacer and a second air gap layer, and the first air gap layer, the first spacer and the second air gap layer are sequentially stacked between sidewalls of the bit lines and the plugs.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 9 are schematic diagrams illustrating a fabricating method of a semiconductor memory device according to a first embodiment in the present disclosure, wherein:

FIG. 1 shows a schematic top view of a semiconductor memory device after forming bit lines and plugs;

FIG. 2 shows a schematic cross-sectional view taken along a cross-line A-A' in FIG. 1;

FIG. 3 shows a schematic cross-sectional view of a semiconductor memory device after forming storage node pads;

FIG. 4 shows a schematic cross-sectional view of a semiconductor memory device after performing an etching process;

FIG. 5 shows a schematic cross-sectional view of a semiconductor memory device after forming an insulating layer;

FIG. 6 shows another schematic cross-sectional view of a semiconductor memory device after forming an insulating layer;

FIG. 7 shows a schematic cross-sectional view of a semiconductor memory device after forming a stacked structure;

FIG. 8 shows a schematic cross-sectional view of a semiconductor memory device after forming a bottom electrode layer; and FIG. 9 shows a schematic cross-sectional view of a semiconductor memory after forming a top electrode layer.

FIG. 11 to FIG. 12 are schematic diagrams illustrating a fabricating method of a semiconductor memory device according to a second embodiment in the present disclosure, wherein:

FIG. 11 shows a schematic cross-sectional view of a semiconductor memory device after forming bit lines and plugs; and FIG. 12 shows a schematic cross-sectional view of a semiconductor memory device after forming an insulating layer.

FIG. 13 to FIG. 14 are schematic diagrams illustrating a fabricating method of a semiconductor memory device according to a third embodiment in the present disclosure, wherein:

FIG. 13 shows a schematic cross-sectional view of a semiconductor memory device after forming bit lines and plugs; and FIG. 14 shows a schematic cross-sectional view of a semiconductor memory device after forming an insulating layer.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
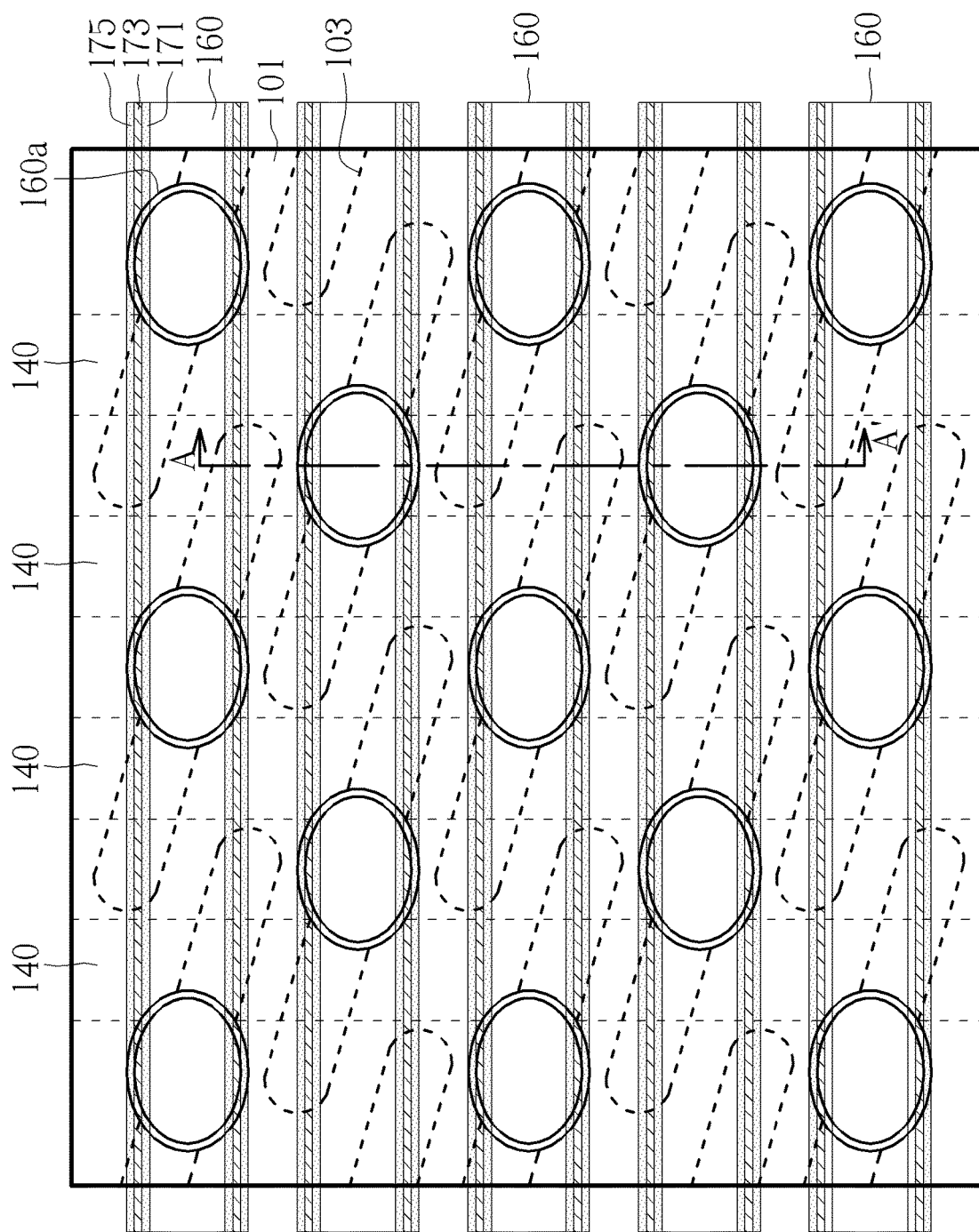

Please refer to FIGS. 1-9, which illustrate schematic diagrams of a fabricating method of a semiconductor memory device 100 according to the first embodiment in the present disclosure, with FIG. 1 illustrating a top view of the semiconductor memory device 100 during the fabricating processes, and with FIGS. 2-9 illustrating a cross-sectional view of the semiconductor memory device 100 during the fabricating processes. The semiconductor memory device 100 of the present embodiment for example includes a dynamic random access memory (DRAM) device, which includes at least one transistor (not shown in the drawings) and at least one capacitor (not shown in the drawings), thereto serve as the smallest unit in the DRAM array for accepting signals from word lines (WLs) 140 and bit lines 160 (BLs) during the operation.

The semiconductor memory device 100 includes a substrate 110, for example a silicon substrate, a silicon containing substrate (such as SiC or SiGe), or a silicon-on-insulator (SOI) substrate, and at least one isolating region 101 for example a shallow trench isolation (STI) is disposed in the substrate 110 to define a plurality of active areas (AA) 103 in the substrate 110. In the present embodiment, each of the active areas 103 are parallel extended along the same direction D1, wherein the direction D1 is for example crossed and not perpendicular to the y-direction or the x-direction, as shown in FIG. 1, but is not limited thereto. The formation of the isolating region is for example accomplished by firstly etching the substrate 110 to form a plurality of trenches (not shown in the drawing), and then filling the trenches with an insulating material (not shown in the drawing), such as silicon oxide (SiOx) or silicon oxynitride (SiON), but not limited thereto.

Figure 2:
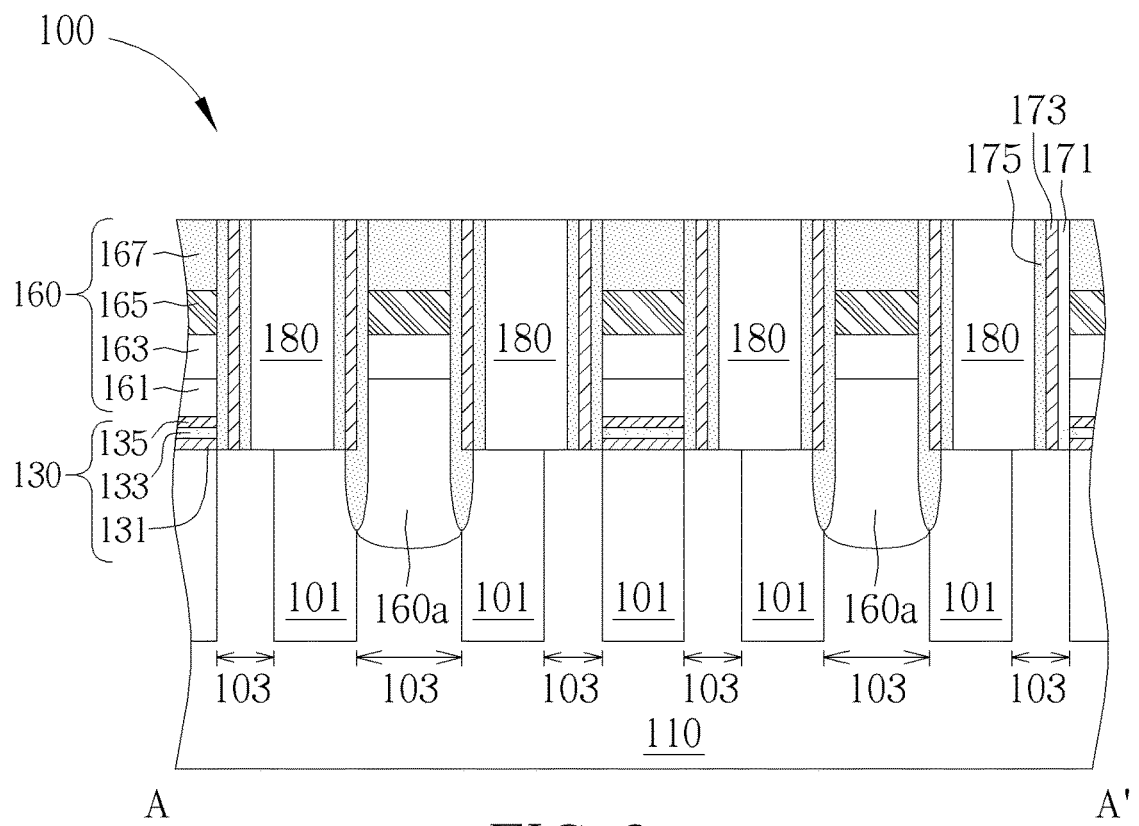

A plurality of buried gates (not shown in the drawings) may be formed in the substrate 110, the buried gates for example extend parallel to each other in the y-direction to cross the active areas 103, thereby serving as the buried word lines (BWL) 140 of the semiconductor device 100. A plurality of bit lines 160 is formed on the substrate 110, each of the bit lines 160 may parallel extend along the x-direction which is perpendicular to the buried word lines 140, to cross the active areas 103 and the buried word lines 140 disposed within the substrate 110 at the same time. The bit lines 160 are respectively formed on a dielectric layer 130 disposed on the substrate 110, and each of the bit lines 160 for example includes a semiconductor layer 161, a barrier layer 163, a metal layer 165, and a capping layer 167 stacked from bottom to top. A portion of the bit lines 160 is further extended into the substrate 110 through the bottom thereof, to serve as a bit line contact (BLCs) 160a. In the present embodiment, the bit line contacts 160a and the semiconductor layer 161 of each bit line 160 may be monolithic, and the bit line contacts 160a directly contacts the substrate 110, as shown in FIG. 2. On the other hand, in one embodiment, the dielectric layer 130 preferably includes a multilayer structure, for example including an oxide layer 131-nitride layer 133-oxide layer 135 (oxide-nitride-oxide, ONO) structure, but is not limited thereto.

Further in view of FIG. 2, a first material layer 171, a first spacer 173, and a second material 175 are sequentially formed on sidewalls of each bit line 160. In one embodiment, the formations of the first material layer 171, the first spacer 173 and the second material layer 175 are accomplished by different deposition processes and etching processes, so that, the first material layer 171, the first spacer 173, and the second material layer 175 may respectively include a stripe shape and different insulating materials. For example, the forming process of the first material layer 171 is firstly carried out by forming a nitride material layer, a silicon carbonitride layer, or a dielectric layer having a low dielectric constant (such as SiNCN, SiOCN or the like), to cover the top surface and the sidewalls of each bit line 160 and the top surface of the dielectric layer 130, followed by performing an etching back process, to partially remove the nitride material layer, the silicon carbonitride layer, or the dielectric layer, to form the first material layer 171 (for example including silicon nitride or silicon carbonitride). Next, the forming process of the first spacer 173 is carried out by entirely depositing a silicon oxide material layer (not shown in the drawings) to cover the top surface of each bit line 160, the first material layer 171, and the top surface of the substrate 110, followed by performing another etching back process, to partially remove the silicon oxide material layer to form the first spacer 173 (for example including silicon oxide material). Then, the forming process of the second material layer 175 is carried out by entirely depositing a silicon nitride material layer (not shown in the drawings) on the bit lines 160 and the substrate 110, to cover the top surface and the sidewalls of each bit line 160 and the top surface of the dielectric layer 130, followed by performing another etching back process, to partially remove the silicon nitride material layer to form the second material layer 175 (for example including silicon nitride material), but not limited thereto. Accordingly, the first material layer 171, the first spacer 173, and the second material layer 175 may all included coplanar top surfaces, as shown in FIG. 2. In additional, before performing the forming process of the first material layer 171, a patterning process of the dielectric layer 130 may be optionally performed, so that, the first material layer 171, the first spacer 173 and the second material layer 175 formed subsequently may be directly on the top surface of the substrate 110. Then, a plurality of plugs 180 may be formed on the substrate 110, and each of the plugs 180 and each of the bit lines 160 may be alternately arranged with each other in the y-direction, such that, the plugs 180 may therefore function like storage node contacts (SNC) of the semiconductor memory device 100 to directly in contact with the substrate 110 (namely, the active areas 103) and/or the isolating region 101 underneath, as shown in FIG. 2. In one embodiment, the plugs 180 for example include a low resistant metal like aluminum (Al), titanium (Ti), copper (Cu), or tungsten (W), but is not limited thereto. With these arrangements, the first material layer 171, the first spacer 173 and the second material layer 175 may be sequentially stacked between the plugs 180 and the bit lines 160 to isolate each of the plugs 180 and each of the bit lines 160.

Figure 3:
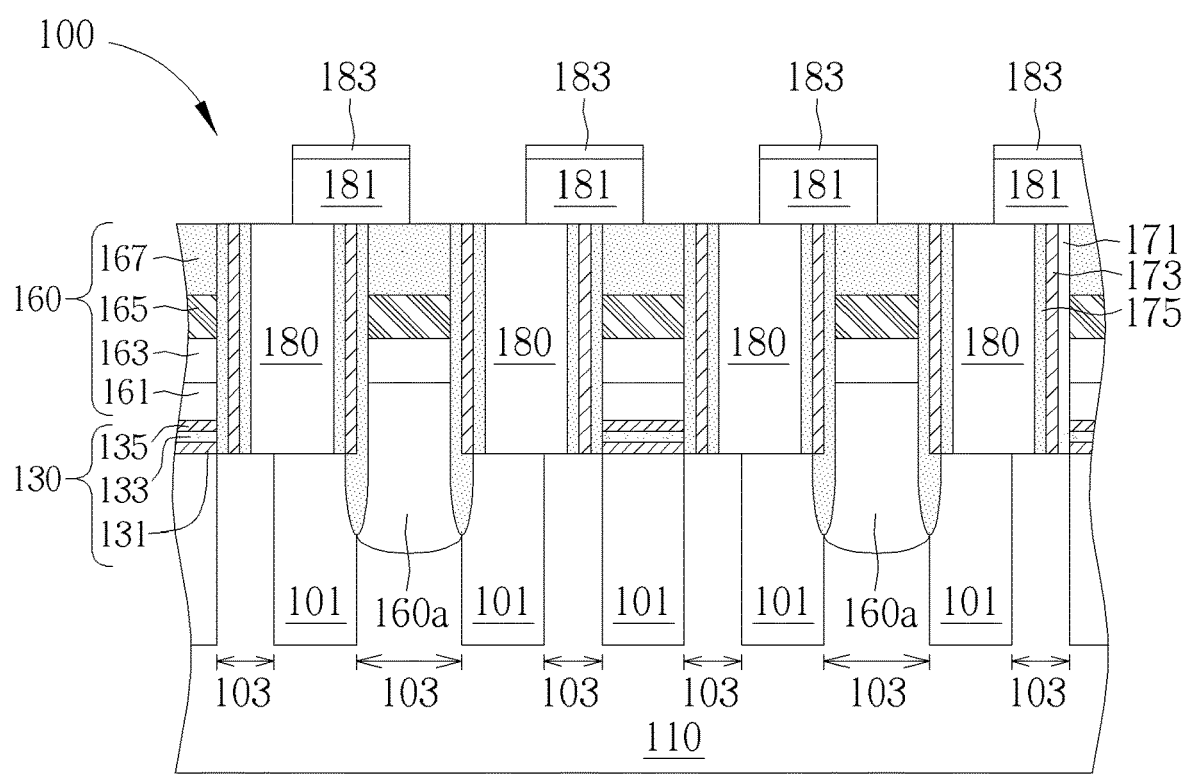

Next, as shown in FIG. 3, a plurality of storage node pads (SN pads) 181 is formed on the plugs 180 and the bit lines 160, to respectively contact the storage node contacts (namely the plugs 180) underneath. The storage node pads 181 may also include a low resistant metal like aluminum, titanium, copper, or tungsten, preferably includes a material different from that of the plugs 180, but is not limited thereto. In one embodiment, the formation of the storage node pads 181 may be accomplished by firstly forming a conductive material layer (for example including a low resistant metal like aluminum, titanium, copper or tungsten, not shown in the drawings) on the plugs 180 and the bit lines 160, followed by forming a plurality of patterned masks 183 on the conductive material layer, and preforming an etching process through the patterned masks 183, to pattern the conductive material layer to form the storage node pads 181. It is noted that, in the present embodiment, each of the storage node pads 181 only partially overlaps with each of the plugs 180 underneath, instead of being completely overlapped with each of the plugs 180, as shown in FIG. 3. With these arrangements, the process windows of the storage node pads 181 may be sufficiently increased while maintaining a good electrical connection between the storage node pads 181 and the plugs 180. Preferably, the storage node pads 181 and the plugs 180 may be monolithic to include the same material, so that, the formation of the storage node pads 181 and the plugs 180 may be simultaneously accomplished, but not limited thereto.

Figure 4:
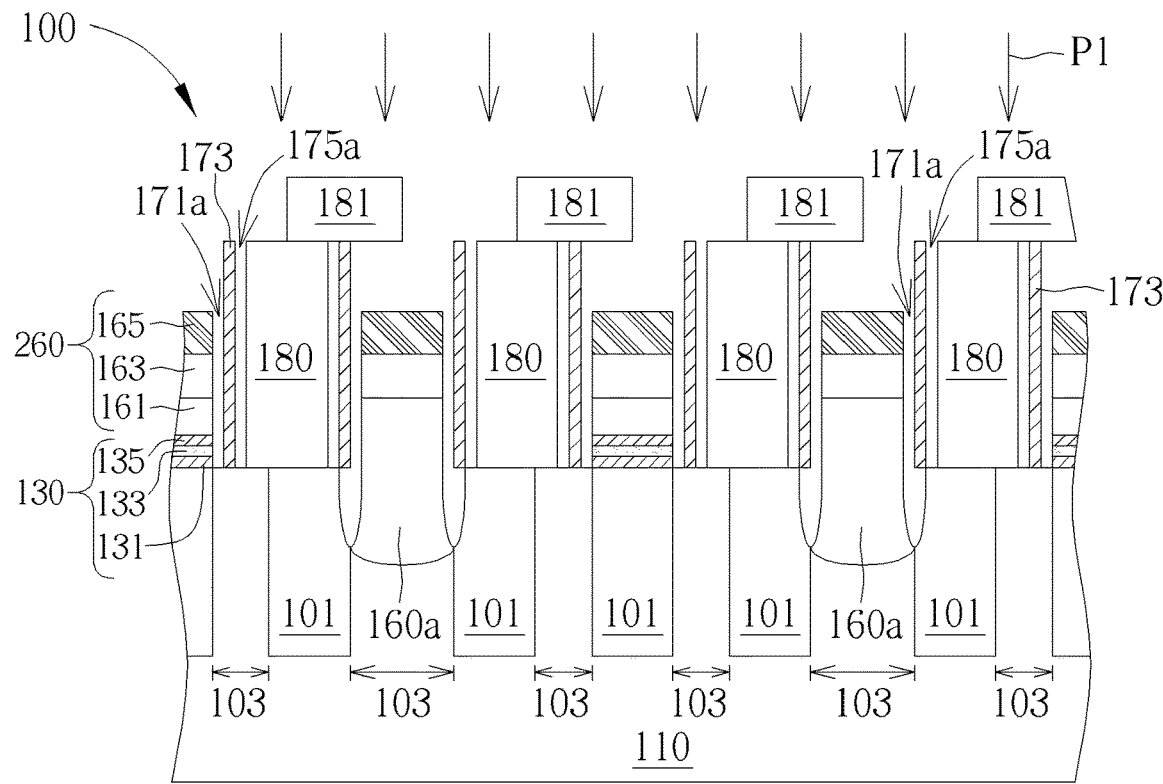

Then, as shown FIG. 4, the patterned masks 183 are completely removed, and the storage node pads 181 are used as a mask to perform an etching process P1 through inserting an etchant, to completely remove the capping layer 167 (including silicon nitride), the first material layer 171 (including silicon nitride or silicon carbonitride), and the second material layer 175 (including silicon nitride) that having similar materials. The etchant preferably includes hot phosphoric acid, but is not limited thereto. In this way, after the etching process P1 is performed, only the metal layer 165, the barrier layer 163 and the semiconductor layer 161 are remained to form each bit line 260, and only the first spacer 173 is remained between each bit line 260 and each plug 180. Then cavities 171a and 175a are formed between the first spacer 173, the bit lines 260 and the plugs 180, respectively.

Figure 5:
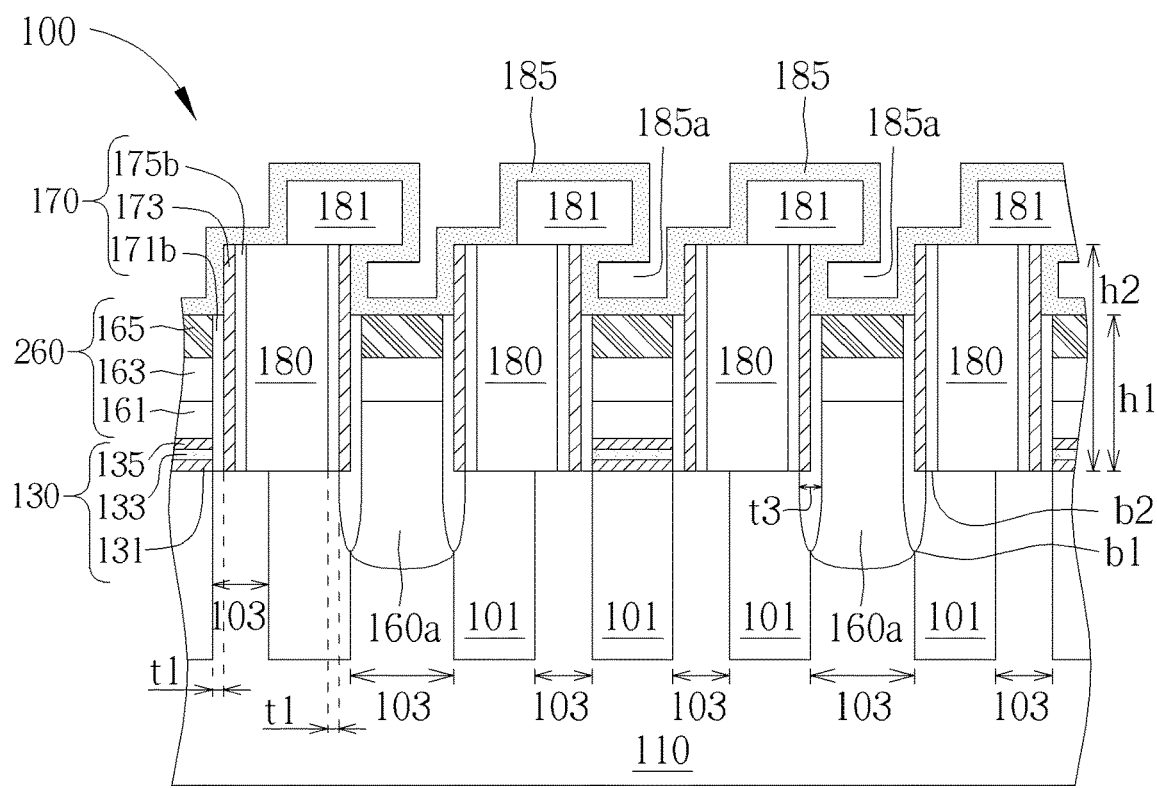
Figure 6:
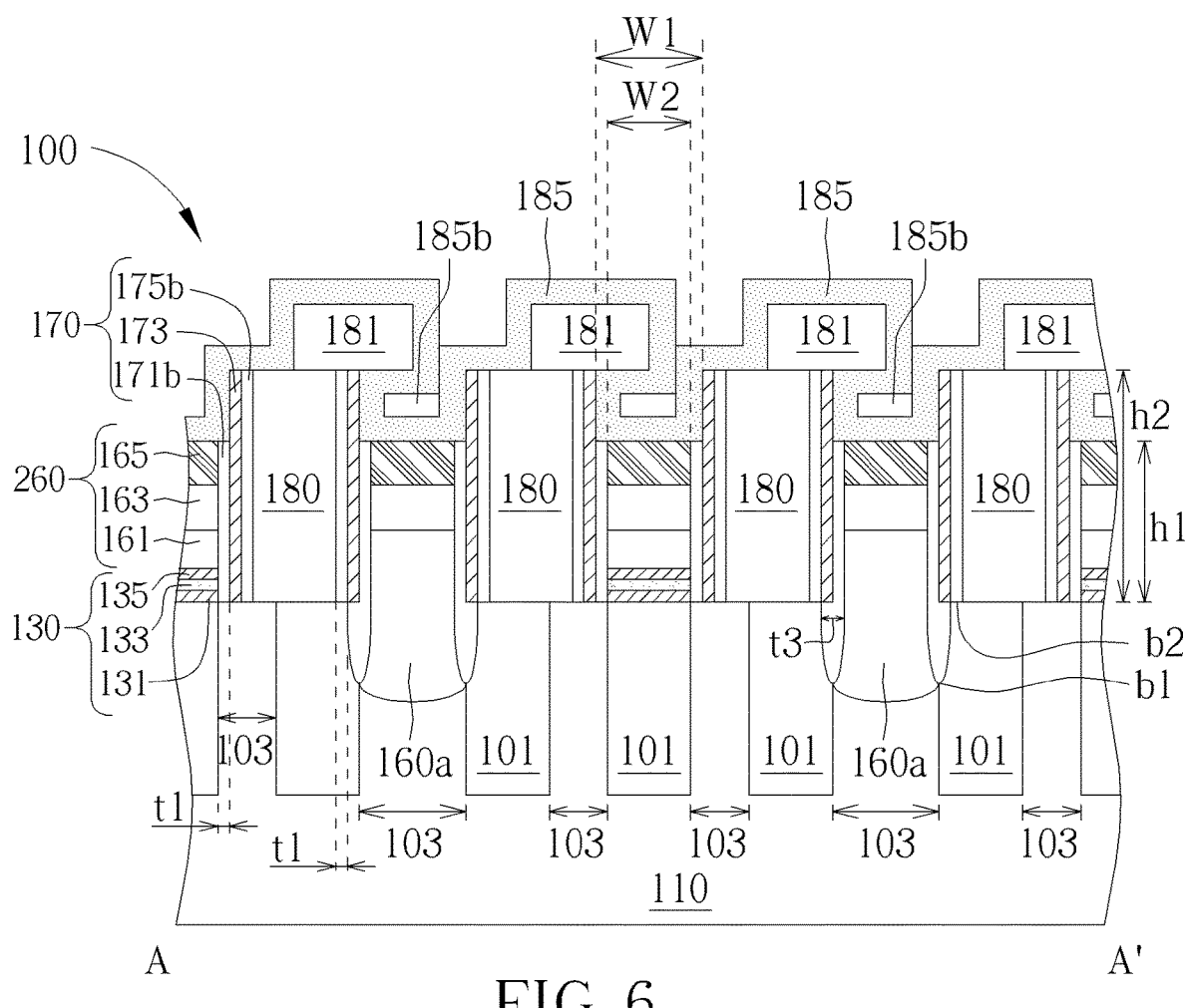

As shown in FIG. 5, an insulating layer 185 is formed on the plugs 180 and the bit lines 260 to enclose the cavities 171a, 175a at two sides of the spacer 173, thereby forming a first air gap layer 171b and a second air gap layer 175b. It is noted that, the first air gap layer 171b is disposed between the first spacer 173 and each bit line 260, and which includes a relative smaller height h1 over the substrate 110, and the second air gap layer 175b is disposed between the first spacer 173 and each plug 180, and which includes a relative greater height h2 over the substrate 110. In other words, topmost surface of the first air gap layer 171b and the second air gap layer 175b are not coplanar with each other, so that, the second air gap layer 175b may directly contact the storage node pads 181 and the first air gap layer 171b may not directly contact the storage node pads 181, as shown in FIG. 5. On the other hand, a portion of the first air gap layer 171b further extends downwardly to dispose at two sides of each of the bit line contacts 160a, which is extended into the substrate 110 and disposed under the first spacer 173. Accordingly, the first air gap layer 171b may therefore obtain a bottommost surface b1 lower than the top surface of the substrate 110, the bottommost surface b1 of the portion of the first air gap layer 171b is lower than the bottommost surface b2 of the second air gap layer 175b, and the bottommost surface b1 of the first air gap layer 171b and the bottommost surface b2 of the second air gap layer 175b are not in the same height, as shown in FIG. 5. Also, since the first air gap layer 171b and the second air gap layer 175b are respectively formed from the cavities 171a, 175a formed by removing the first material layer 171 and the second material layer 175, the first air gap layer 171b and the second air gap layer 175b may substantially include the same width t1 in the y-direction. The portion of the first air gap layer 171b which is extended into the substrate 110 includes a relative greater width t3 (t3>t1) to directly contact the substrate 110 and the bottommost surface of the first spacer 173. Through these arrangements, the first air gap layer 171b, the first spacer 173 and the second air gap layer 175b sequentially stacked between each plug 180 and each bit line 260 may together form a spacer structure 170. Furthermore, it is also noted that the insulating layer 185 is conformally formed on the bit lines 260, the spacer structure 170, the plugs 180, and the storage node pads 181, so that, the insulating layer 185 may partially fill in the spacer formed by removing the capping layer 167, to directly contact the top surface of the metal layer 165, the sidewall of the first spacer 173, and the top surface of the second air gap layer 175b. Then the insulating layer 185 may therefore surrounds a half-opened cavity 185a above each bit line 260, and the width w1 of the bottom surface of the half-opened cavity 185a is greater than the width w2 of each bit line 260, as shown in FIG. 5, but is not limited thereto. In another embodiment, based on practical requirements of the fabricating processes, the insulating layer may also completely fill in the space formed by removing the capping layer 167, or the insulating layer 185 may also surround an enclosed cavity 185b above each bit line 260, as shown in FIG. 6.

Figure 7:
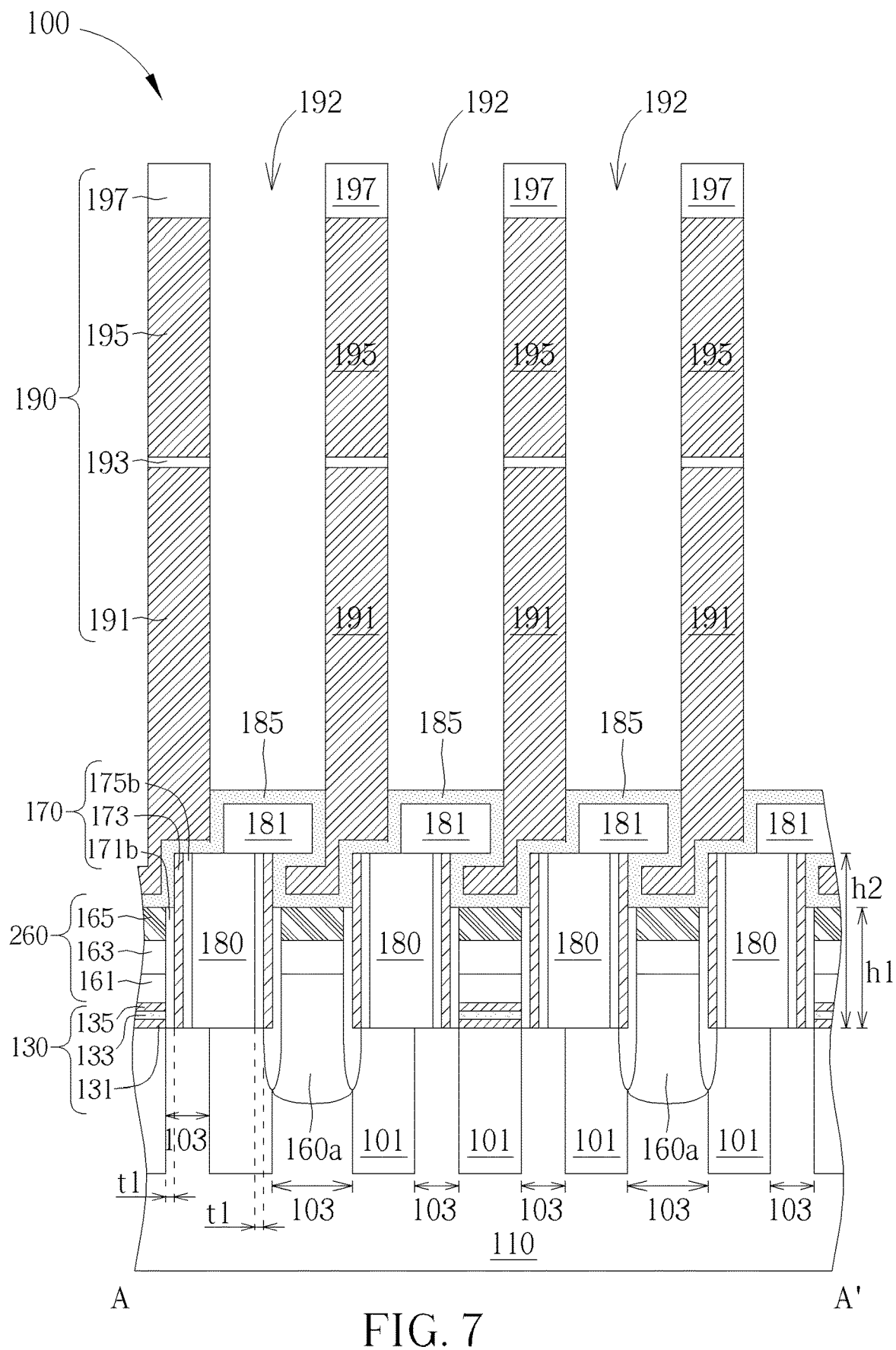

Next, as shown in FIG. 7, a capacitor structure 210 may be formed on the substrate 110 to directly contact the storage node pads 181 for electrically connected thereto. In one embodiment, the formation of the capacitor structure 210 includes but not limited to the following steps. Firstly, a supporting structure 190 is formed on the substrate 110, and the supporting structure 190 for example includes at least one oxide layer and at least one nitride layer alternately stacked on the substrate 110. In the present embodiment, the supporting structure 190 for example includes a first supporting layer 191 (for example including silicon oxide), a second supporting layer 193 (for example including silicon nitride or silicon oxynitride), a third supporting layer 195 (for example including silicon oxide), and a fourth supporting layer 197 (for example including silicon nitride or silicon carbonitride), but is not limited thereto. The first supporting layer 191 may further fill up the cavity 185a which is surrounded by the insulating layer 185, as shown in FIG. 7. Preferably, the first supporting layer 191 and the third supporting layer 195 may include a relative greater thickness, for example being about 5 times to 10 times greater than that of other supporting layers (such as the second supporting layer 193 and the fourth supporting layer 197), but is not limited thereto. Accordingly, the entire thickness of the supporting structure 190 may achieve about 1600 angstroms to 2000 angstroms, but is not limited thereto. People in the art should fully understand that the practical number of the aforementioned oxide layer (for example the first supporting 191 and the third supporting layer 195) and the aforementioned nitride layer (for example the second supporting layer 193 and the fourth supporting layer 197) is not limited to be above mentioned number, and which may be further adjusted based on practical product requirements, for example being three layers, four layer layers or other number. After that, a plurality of openings 192 may be formed in the supporting layer 190, to penetrate through the fourth supporting layer 197, the third supporting layer 195, the second supporting layer 193, and the first supporting layer 191 to in align with the storage node pads 181 underneath. Then, the insulating layer 185 covered on each storage node pad 181 may therefore be exposed from each opening 192, as shown in FIG. 7.

Figure 8:
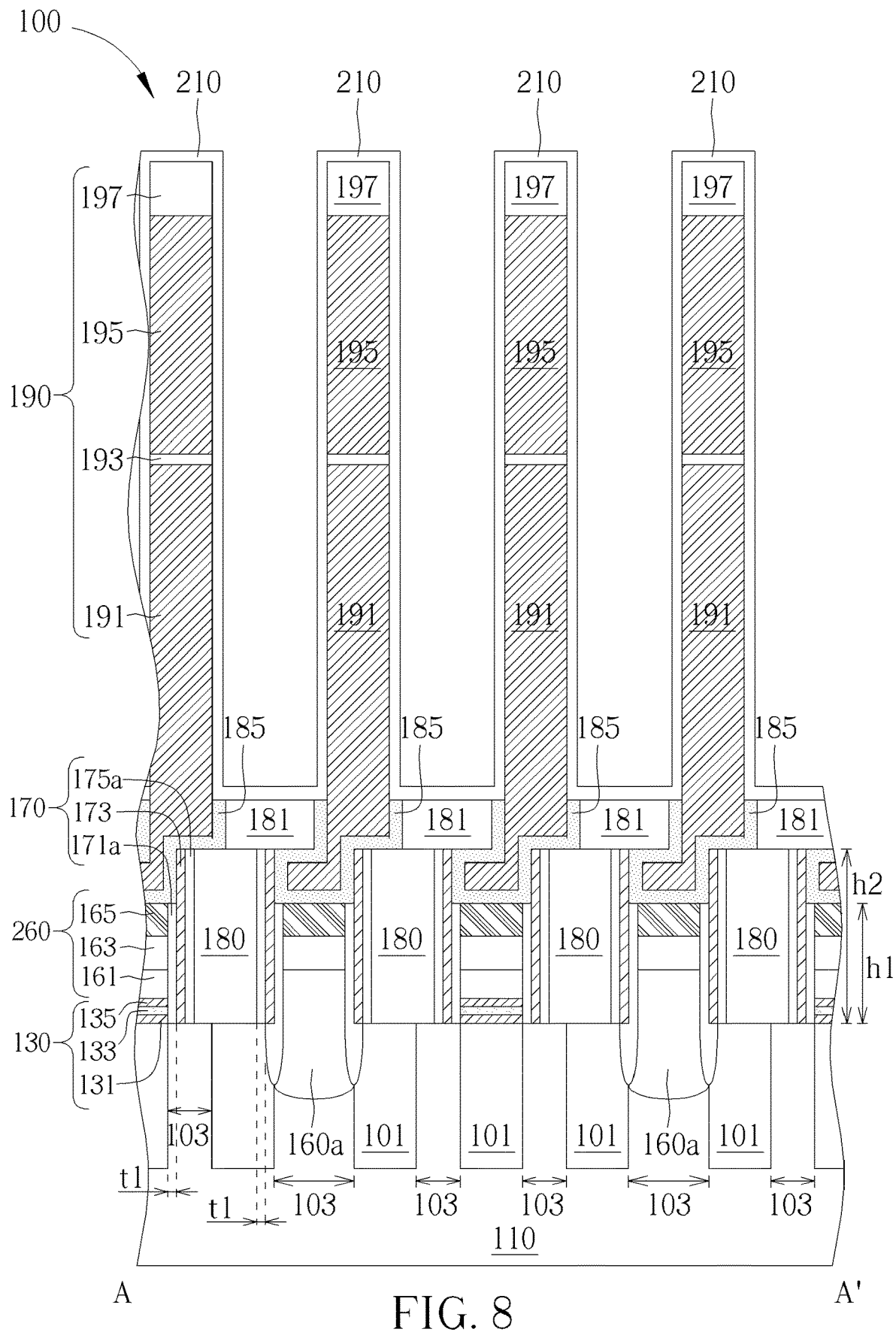
Figure 9:
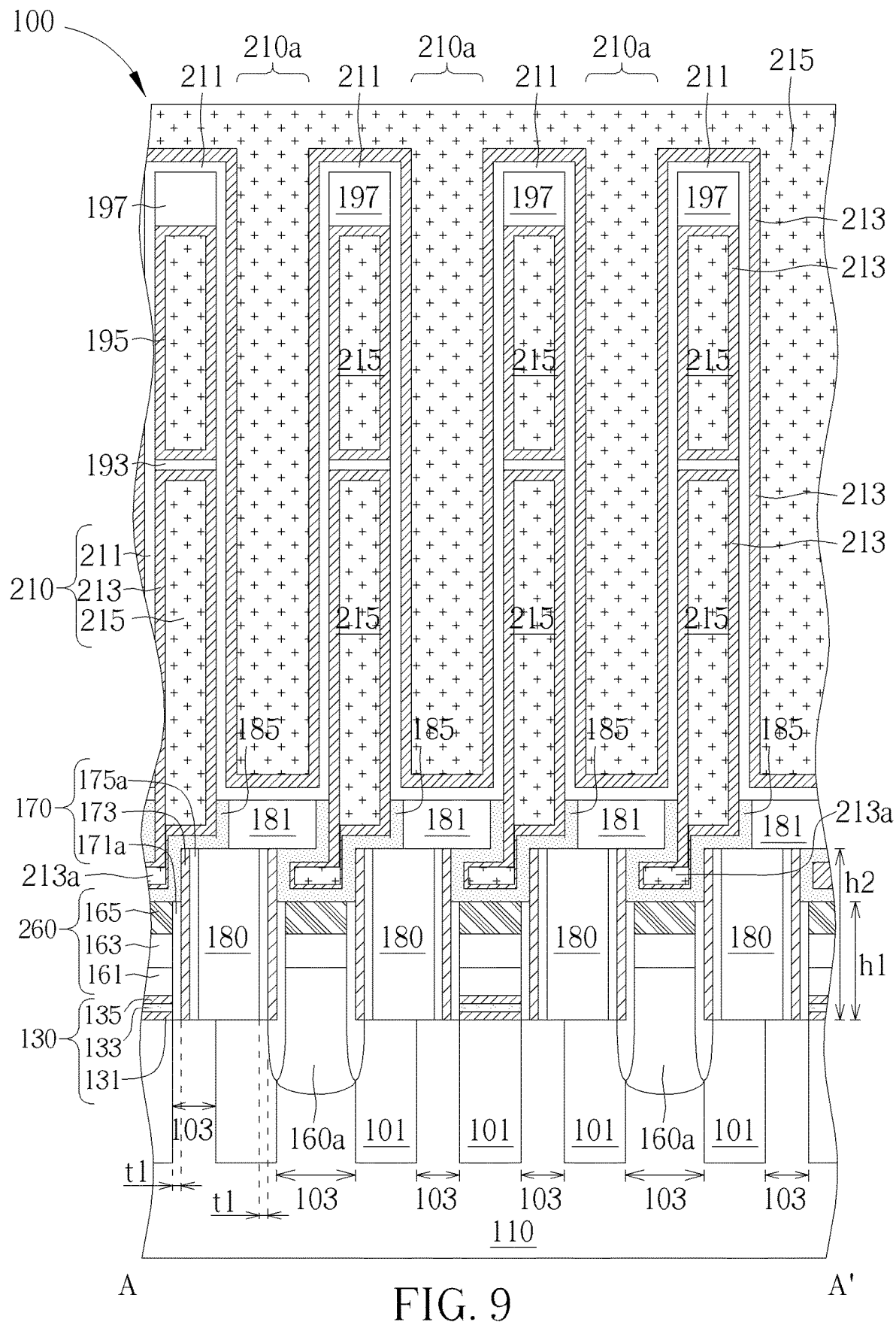

As shown in FIG. 8, the exposed insulating layer 185 is removed through the openings 192, and a bottom electrode layer 211 is formed to entirely cover the top surface of the supporting structure 190 and surfaces of the openings 192. The bottom electrode layer 211 for example includes a low resistant metal like aluminum, titanium, copper, or tungsten, preferably includes titanium, but is not limited thereto. Then, as shown in FIG. 9, after forming the bottom electrode layer 211, an etching process (not shown in the drawings) may be performed through a mask layer (not shown in the drawings), to completely remove the oxide layer (the first supporting 191 and the third supporting layer 195) of the supporting structure 190, and a capacitor dielectric layer 213 and a top electrode layer 215 are sequentially formed on the bottom electrode layer 211. The capacitor dielectric layer 213 and the top electrode layer 215 may further fill in the space between the second supporting layer 193 and the fourth supporting layer 197, and also, fill in the space between the second supporting layer 193 and the insulating layer 185. It is noted that, the capacitor dielectric layer 213 may further fill in the half-opened cavity 185a, to surround an enclosed cavity 213a, as shown in FIG. 9. Accordingly, the capacitor dielectric layer 213 filled in the half-opened cavity 185a may include a bottommost surface lower than the bottom surface of the storage node pads 181. Through these performances, the formation of the capacitor structure 210 is completely, and the capacitor structure 210 includes the bottom electrode layer 211, the capacitor dielectric layer 213, and the top electrode layer 215 stacked sequentially, so as to form a plurality of vertically extended capacitors 210a, being in alignment with the storage node pads 181 underneath, respectively. Then, the capacitors 210a may therefore serve as storage node (SN) of the semiconductor memory device 100. In one embodiment, the capacitor dielectric layer 213 for example includes a high dielectric constant dielectric material which is selected from the group consisting of hafnium oxide ($HfO_2$), hafnium silicon oxide (HfSiO$_4$), hafnium silicon oxynitride (HfSiON), zinc oxide ($ZrO_2$), titanium oxide ($TiO_2$) and zirconia-alumina-zirconia (ZAZ), and preferably includes zirconia-alumina-zirconia. The top electrode layer 215 for example includes a low resistance metal material such as aluminum, titanium, copper or tungsten, and preferably includes titanium, but not limited thereto.

According to the fabricating method of the semiconductor memory device 100 of the first embodiment, the storage node pads 181 is used as a mask to remove the first material layer 171 and the second material layer 175 stacked between the bit lines 160 and the storage node contacts (namely the plugs 180), thereby forming the spacer structure 170 with a bilayer airgaps 171b, 175b. Through these performances, the storage nodes may electrically connect to the transistors disposed in the substrate 110 through the storage node pads 181 and the storage node contacts (namely, the plugs 180), and the spacer structure 170 with the bilayer airgaps 171b, 175b may effectively improve the delay between the resistor and the capacitor, so as to enhance the functions and the performances of the semiconductor memory device 100. In the present embodiment, the topmost surfaces of the first air gap layer 171b and the second air gap layer 175b are not coplanar with each other. The first air gap layer 171b and the second air gap layer 175b include substantially the same width t1, and which are respectively disposed at two sides of the first spacer 173 to further electrically isolate the bit lines 260 and the storage node contacts (namely, the plugs 180).

Figure 10:
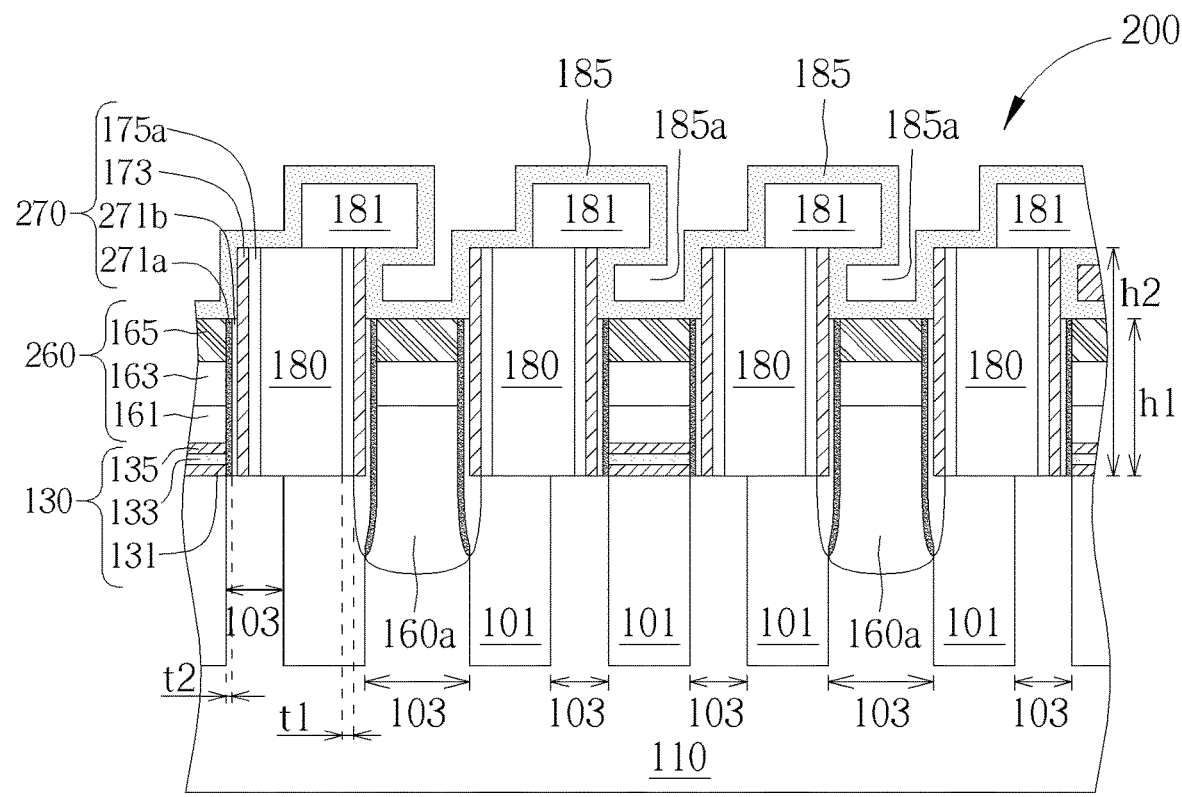
FIG. 10 is a schematic diagram illustrating a semiconductor memory device according to another embodiment in the present disclosure.

People well known in the arts should easily realize the semiconductor memory device and the fabricating method thereof in the present disclosure is not limited to the aforementioned embodiment, and may further include other examples or variety. For example, in another embodiment, the etching conditions of the etching process P1 may be further adjusted based on practical product requirements, to completely remove the capping layer 167 (including silicon nitride) and the second material layer 175 (including silicon nitride) that having the same material, and to partially remove the first material layer 171 (including silicon nitride or silicon carbonitride) that having a similar material. Then, after performing the etching process P1, the cavity 175a formed by removing the second material layer 175 may also form the second air gap layer 175b, a cavity (not shown in the drawings) formed by partially removing the first material layer 171 may form a first air gap layer 271b, and the remained first material layer 171 may form a second spacer 271a (including silicon carbonitride) disposed between the first air gap layer 271b and each bit line 260, as shown in FIG. 10. Otherwise, the first material layer may further include a multilayer structure (not shown in the drawings, for example including a low dielectric constant dielectric material like SiCN, SiBCN, or SiOCN, and an silicon oxide material stacked sequentially), and the low dielectric constant dielectric material is at least partially moved or completely removed during the etching process P1, to form the first air gap layer, and the remained silicon oxide material may form the second spacer, but not limited thereto. The top surfaces of the first air gap layer 271b (having the height h1) and the second air gap layer 175b (having the height h2) are not coplanar with each other, and the first air gap layer 271b obviously includes a relative smaller thickness t2, and the second air gap layer 175b includes a relative greater thickness t1. With these performances, the semiconductor memory device 200 of the present embodiment also include a spacer structure 270 having a bilayer airgaps 271b, 175b, wherein the second spacer 271a (including silicon carbonitride), the first air gap layer 271b, the first spacer 173, and the second air gap layer 175b are sequentially stacked between each plug 180 and each bit line 260. In this way, the delay between the resistor and the capacitor may also be effectively improved, to enhance the functions and the performances of the semiconductor memory device 200.

The following description will detail the different embodiments of the semiconductor memory device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
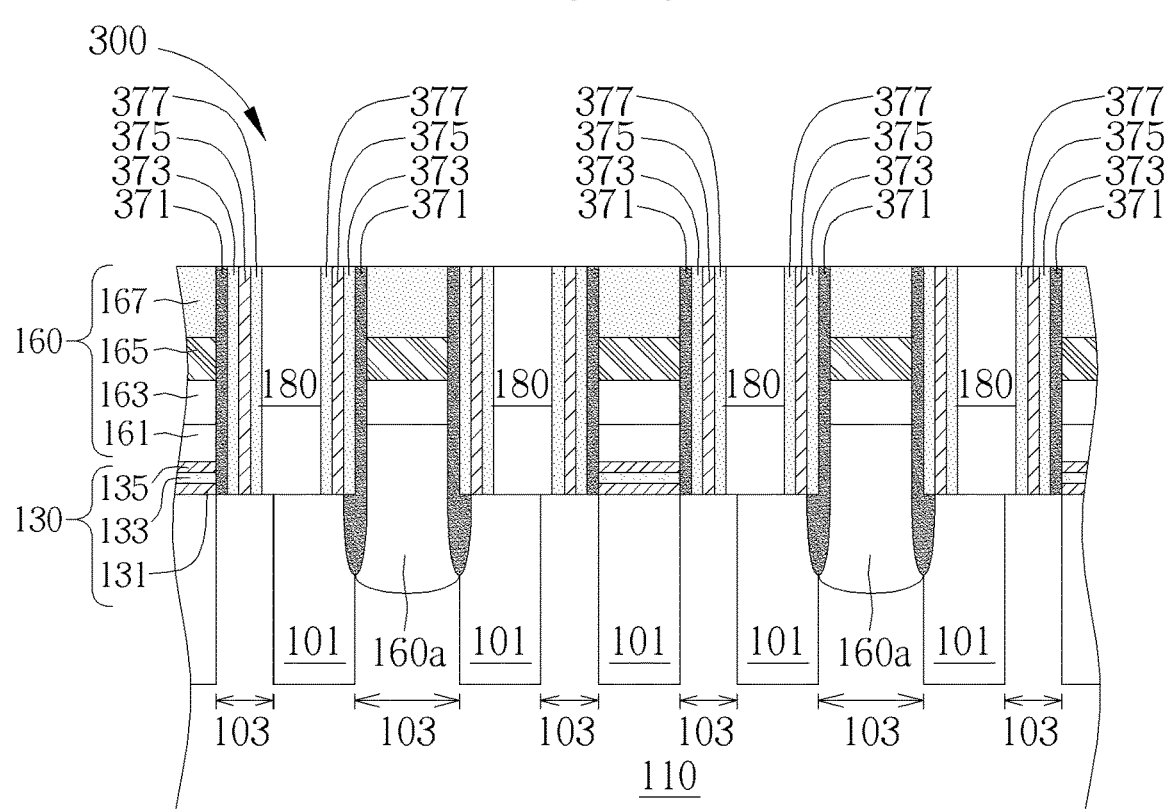
Figure 12:
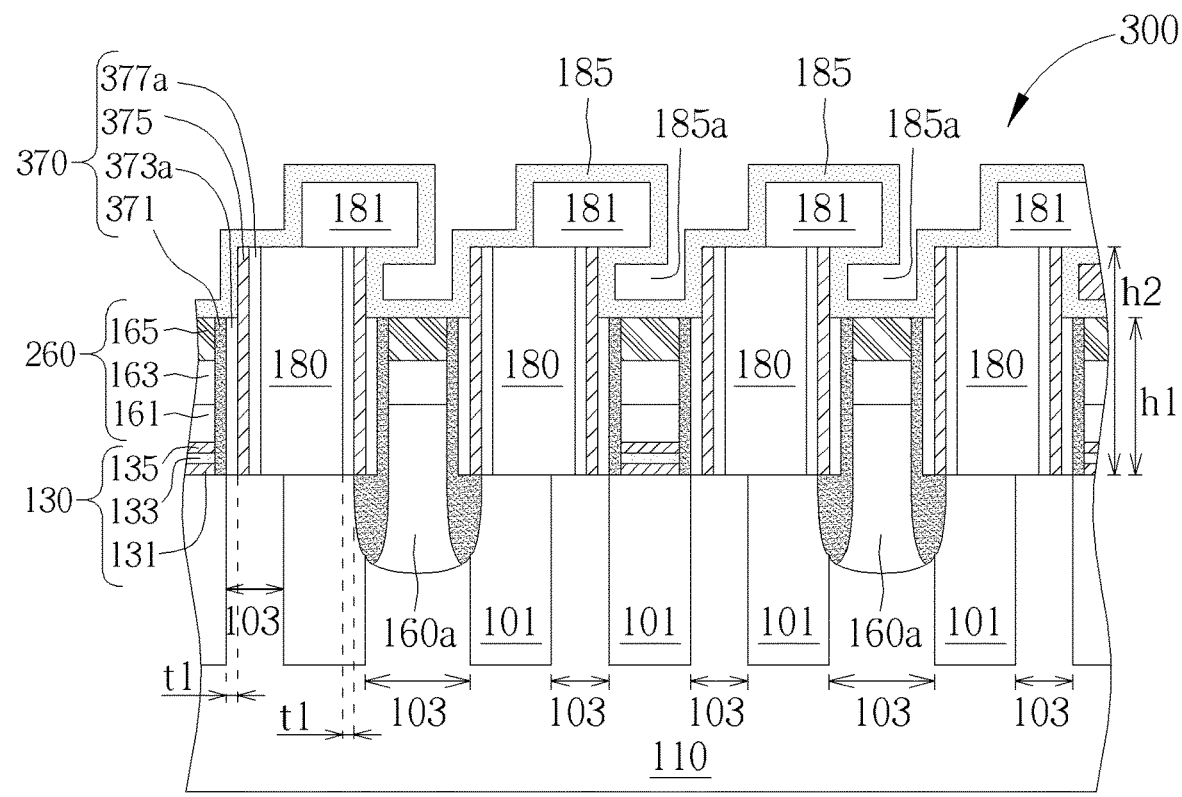

Please refer to FIG. 11 to FIG. 12, which illustrate schematic diagrams of a fabricating method of a semiconductor memory device 300 according to the second embodiment in the present disclosure. The forming processes of the semiconductor memory device 300 in the present embodiment are substantially the same as those of the semiconductor memory device 100 in the aforementioned first embodiment, and all the similarities will not be redundantly described herein after. The difference between the present embodiment and the aforementioned first embodiment is in that a spacer structure 370 of the semiconductor memory device 300 includes a second spacer 371, a first air gap layer 373a, a first spacer 375, and a second air gap layer 377a.

Precisely speaking, as shown in FIG. 11, the second spacer 371, a first material layer 373, the first spacer 375, and a second material layer 377 are sequentially formed on sidewalls of each bit line 160 (including the semiconductor layer 161, the barrier layer 163, the metal layer 165 and the capping layer 167 stacked from bottom to top), wherein the formations of the second spacer 371, the first material layer 373, the first spacer 375, and the second material layer 377 may be accomplished through different deposition and etching processes. Then, each of the second spacer 371, the first material layer 373, the first spacer 375, and the second material layer 377 may all include a stripe shape and different insulating materials. In the present embodiment, the forming processes of the second spacer 371, the first material layer 373, the first spacer 375, and the second material layer 377 are substantially the same as those of the first material layer 171, the first spacer 173 and the second material layer 175 in the aforementioned first embodiment, and preferably, the second spacer 371 may include silicon carbonitride, the first material layer 373 and the second material layer 377 may both include silicon nitride, and the first spacer 375 may include silicon oxide, but not limited thereto.

After that, the forming processes as shown in FIGS. 3-5 in the aforementioned first embodiment may be sequentially performed to form the spacer structure 370 with a bilayer airgaps 373a, 377a. As shown in FIG. 12, the first air gap layer 373a and the second air gap layer 377a are respectively disposed at two sides of the first spacer 375. It is noted that, the first air gap layer 373a is disposed between the first spacer 375 and the second spacer 371, and the first air gap layer 373a and the second air gap layer 371 include a relative smaller height over the substrate 110. The second air gap layer 377a is disposed between the first spacer 375 and each plug 180, and which include a relative greater height h2 over the substrate 110. In other words, the top surfaces of the first air gap layer 373a and the second air gap layer 377a are not coplanar with each other, as shown in FIG. 12. On the other hand, since the first air gap layer 373a and the second air gap layer 377a are respectively formed from cavities (not shown in the drawings) formed by removing the first material layer 373 and the second material layer 377, the first air gap layer 373a and the second air gap layer 377a may have substantially the same width t1 in the y-direction.

According to above-mentioned processes, the fabricating method of the semiconductor memory device 300 in the second embodiment also forms the spacer structure 370 with the bilayer airgaps 373a, 377a. in this way, the storage nodes may electrically connect to the transistors disposed in the substrate 110 through the storage node pads 181 and the storage node contacts (namely, the plugs 180), and the spacer structure 370 with the bilayer airgaps 373a, 377a may effectively improve the delay between the resistor and the capacitor, so as to enhance the functions and the performances of the semiconductor memory device 300. Also, in the present embodiment the spacer structure 370 includes the bilayer airgaps 373a, 377a and the bilayer spacers 371, 375 stacked alternately, and which may improve the delay between the resistor and the capacitor, and also provide further supporting to the spacer structure 370. Meanwhile, the bilayer spacers 371, 375 may protect the sidewalls of the metal layer 165 to prevent from being etched during the etching process P1. Thus, the semiconductor memory device 300 achieves the advantages of improved performances and improved structural integrity at the same time.

Figure 13:
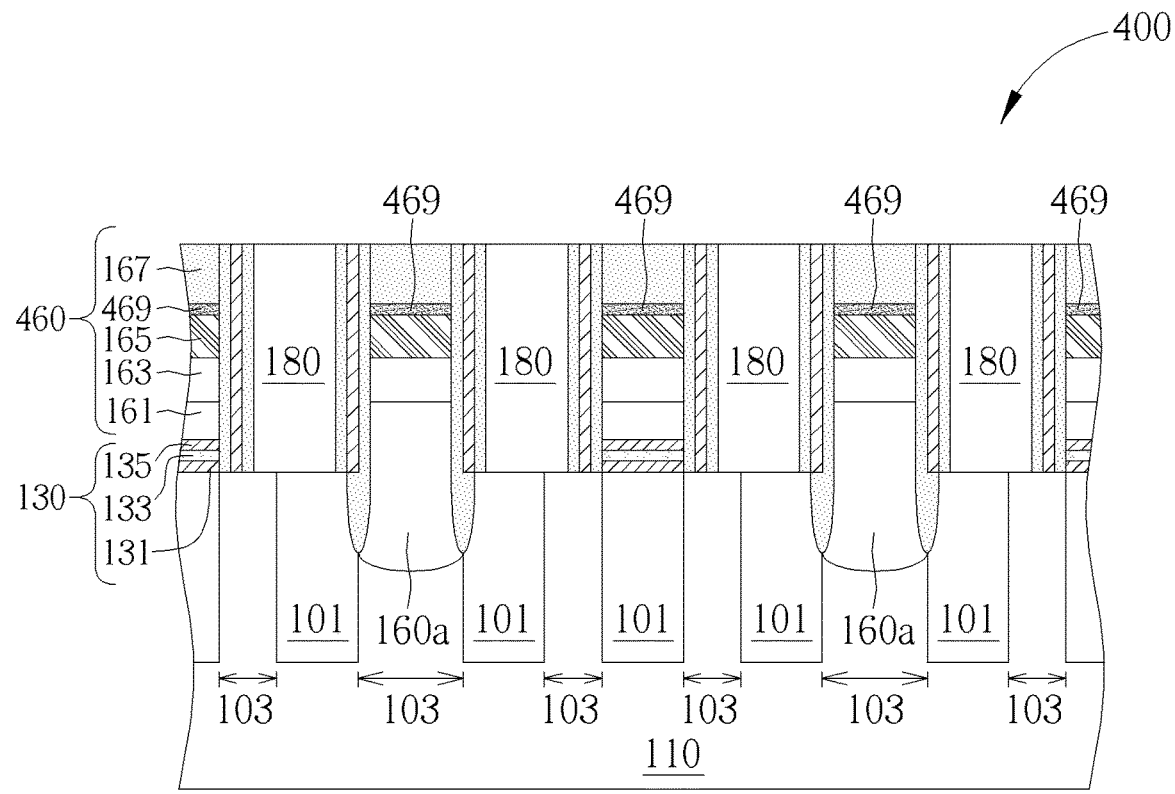
Figure 14:
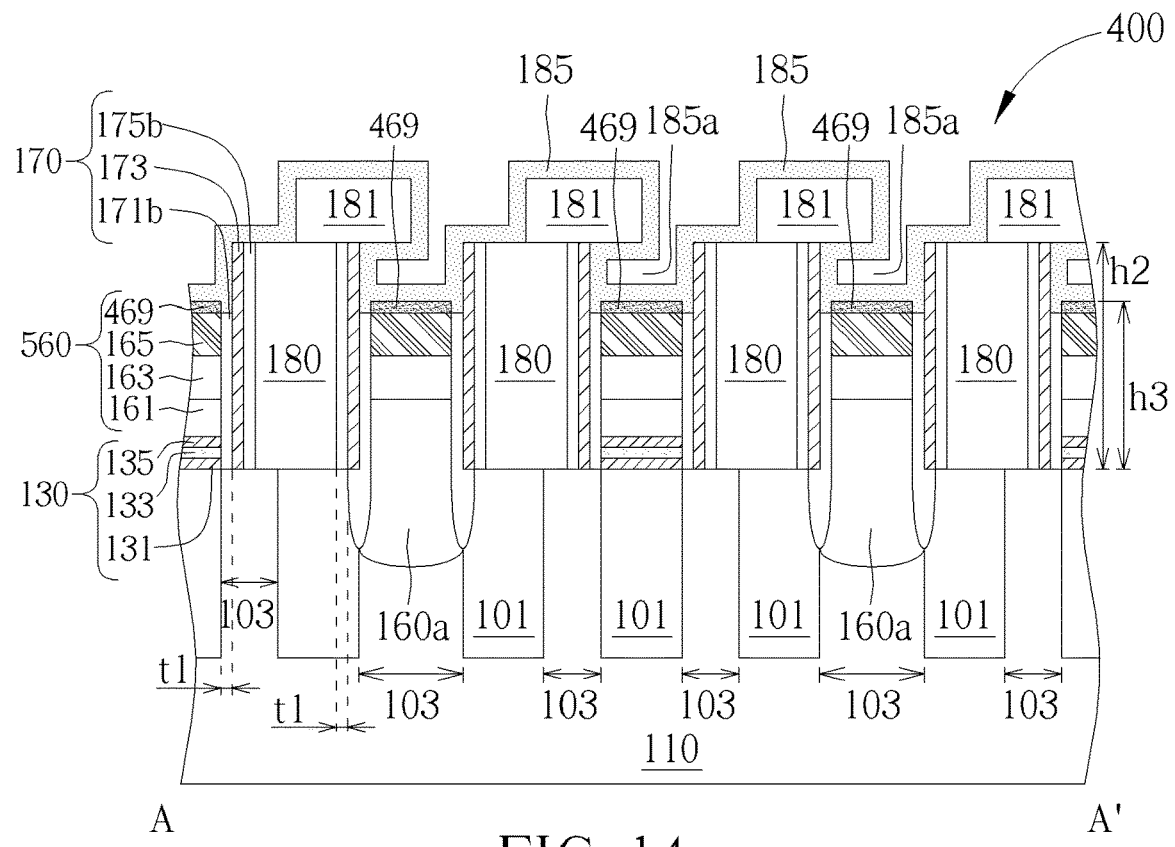

Please refer to FIGS. 13-14, which illustrate schematic diagrams of a fabricating method of a semiconductor memory device 400 according to the third embodiment in the present disclosure. The forming processes of the semiconductor memory device 400 in the present embodiment are substantially the same as those of the semiconductor memory device 100 in the aforementioned first embodiment, and all the similarities will not be redundantly described herein after. The difference between the present embodiment and the aforementioned first embodiment is in that after performing the etching process P1, each bit line 560 includes the semiconductor layer 161, the barrier layer 163, the metal layer 165 and a protection layer 469 stacked form bottom to top.

Precisely speaking, as shown in FIG. 13, each of the bit lines 460 additionally includes a protection layer 469 disposed between the metal layer 165 and the capping layer 167, to protect the metal layer 165. In one embodiment, the metal layer 165 for example includes a material the same as that of the first material layer 171, such as silicon carbonitride, but is not limited thereto. After that, the forming processes as shown in FIGS. 3-5 in the aforementioned first embodiment may be sequentially performed to form the spacer structure 170 with the bilayer airgap 171b, 175b. On the other hand, as shown in FIG. 14, after performing the etching process P1, the capping layer 167 (including silicon nitride) disposed on the top of each bit line 460 may be completely removed, to remain the protection layer 469 (including silicon carbonitride), the metal layer 165, the barrier layer 163 and the semiconductor layer 161, thereby forming the bit lines 560.

According to above-mentioned processes, the fabricating method of the semiconductor memory device 400 in the third embodiment also form the spacer structure 170 with the bilayer airgaps 171b, 175b. Also, since the protection layer 469 is additionally disposed in the present embodiment, the top surface of the metal layer 165 is protected to prevent from being etched during the etching process P1. Thus, the semiconductor memory device 400 achieve the advantages of improved performances and improved structural integrity at the same time.

Figure 15:
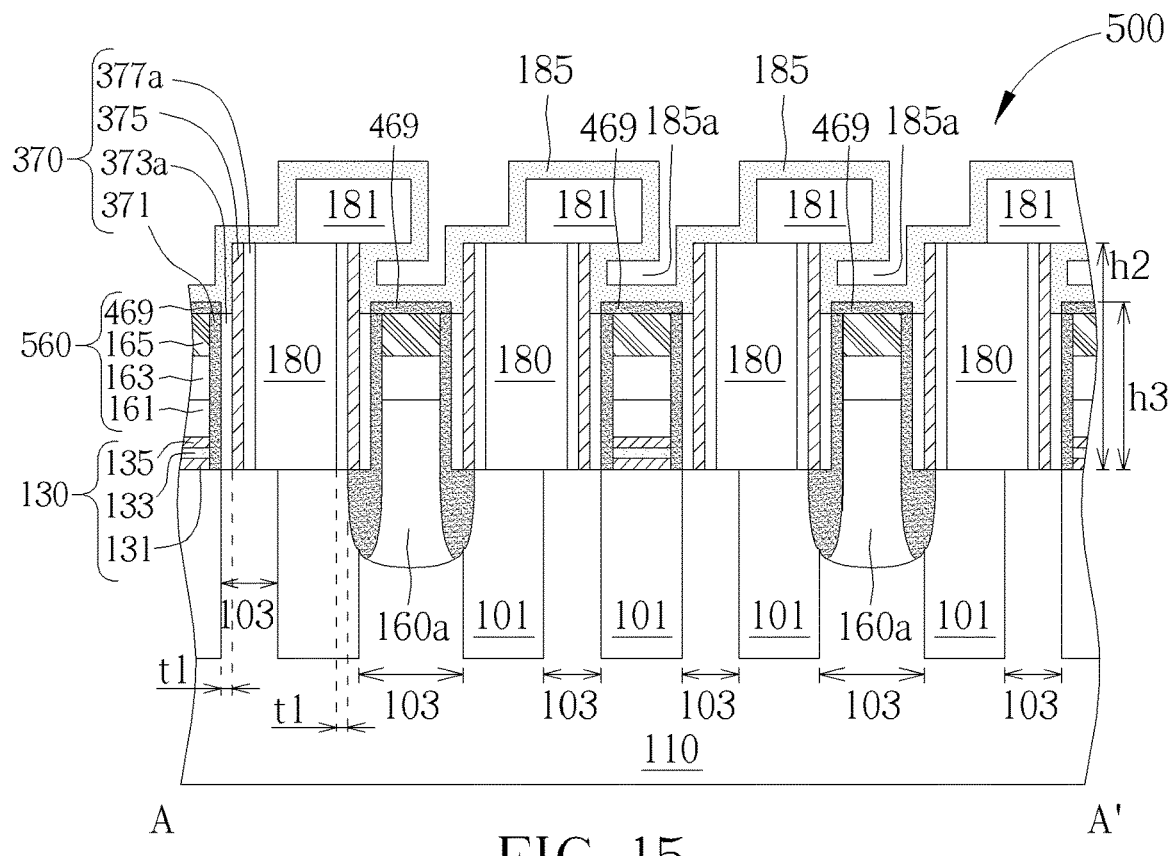
FIG. 15 is a schematic diagram illustrating a semiconductor memory device according to a fourth embodiment in the present disclosure.

Please refer to FIG. 15, which illustrate a schematic diagram of a semiconductor memory device 500 according to the fourth embodiment in the present disclosure. The structure of the semiconductor memory device 500 in the present embodiment are substantially the same as those of the semiconductor memory device 300 in the aforementioned second embodiment, and all the similarities will not be redundantly described herein after. The difference between the present embodiment and the aforementioned second embodiment is in that after performing the etching process P1, each bit line 560 includes the semiconductor layer 161, the barrier layer 163, the metal layer 165 and a protection layer 469 stacked form bottom to top, wherein the protection layer 469 preferably include the material the same as that of the second spacer 371, for example including silicon carbonitride, but is not limited thereto. In other words, the top surface and the sidewalls of the metal layer 165 in the present embodiment are respectively protected by the protection layer 469 and the second spacer 371, to prevent from being etched during the etching process P1.

Accordingly, the semiconductor memory device 500 in the fourth embodiment also includes the spacer structure 370 having the bilayer airgaps 373a, 377a and the bilayer spacers 371, 375 stacked alternately, and the spacer structure 370 may improve the delay between the resistor and the capacitor, and also provide further supporting. Meanwhile, the second spacer 371 and the protection layer 469 may respectively protect the top surface and the sidewalls of the metal layer 165, to prevent from being etched during the etching process P1. Thus, the semiconductor memory device 500 achieves the advantages of improved performances and improved structural integrity at the same time.

Overall speaking, the fabricating method of the present disclose utilizes the storage node pads as a mask to remove the material layers between the bit liens and the storage node contacts, to form the spacer structure with the bilayer airgaps. With these arrangements, the storage nodes may electrically connect to the transistors within the substrate through the storage node pads and the storage node contacts, and the spacer structure with the bilayer airgaps may effectively improve the delay between the resistor and the capacitor, so as to enhance the functions and the performances of the semiconductor memory device. Furthermore, the present disclose may optionally dispose the spacer structure having the bilayer airgap and the bilayer spacer alternately stacked between the bit lines and the storage node contacts, so as to achieve the advantages of improved performances and improved structural integrity at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate;
   a plurality of bit lines separately disposed on the substrate;
   a plurality of plugs disposed on the substrate, the plugs and the bit lines being alternately arranged with each other;
   a spacer structure, disposed on the substrate between each of the bit lines and each of the plugs;
   a plurality of storage node pads disposed on the plugs and the bit lines, wherein the storage node pads respectively contact the plugs;
   a plurality of capacitors disposed on the storage node pads to respectively in alignment with the storage node pads, each of the capacitors comprising a bottom electrode layer, a capacitor dielectric layer, and a top electrode layer stacked sequentially, wherein a bottommost surface of the capacitor dielectric layer is lower than a topmost surface of the storage node pads; and
   an insulating layer disposed on the bit lines, the plugs and the spacer structure, wherein each of the bit lines comprises a semiconductor layer, a barrier layer and a metal layer stacked sequentially, and the insulating layer directly contacts the metal layer.

2. The semiconductor memory device according to claim 1, wherein the bottommost surface of the capacitor dielectric layer is lower than a bottommost surface of the storage node pads.

3. The semiconductor memory device according to claim 1, wherein a portion of the capacitor dielectric layer disposed on each of the bit lines surrounds a cavity.

4. The semiconductor memory device according to claim 3,
   wherein a portion of the insulating layer disposed on the bit lines surrounds the portion of the capacitor dielectric layer and the cavity.

5. The semiconductor memory device according to claim 4, wherein a width of a bottom surface of the cavity is larger than a width of the bit lines.

6. The semiconductor memory device according to claim 1, further comprising:
   a protection layer disposed on each of the bit lines, between the insulating layer and the bit lines.

7. The semiconductor memory device according to claim 1, wherein the spacer structure comprises a first air gap layer, a first spacer and a second air gap layer, and the first air gap layer, the first spacer and the second air gap layer are sequentially stacked between sidewalls of the bit lines and the plugs.

8. The semiconductor memory device according to claim 7, wherein the first air gap layer does not directly contact the storage node pads.

9. The semiconductor memory device according to claim 8, wherein the second air gap layer directly contacts the storage node pads.

10. The semiconductor memory device according to claim 7, wherein the spacer structure comprises a second spacer disposed between the sidewalls of the bit lines and the first air gap layer, and the second spacer does not directly contact the storage node pads.

11. The semiconductor memory device according to claim 10, wherein the second spacer and the first spacer comprises different material.

12. A semiconductor memory device, comprising:
    a substrate;
    a plurality of bit lines separately disposed on the substrate;
    a plurality of plugs disposed on the substrate, the plugs and the bit lines being alternately arranged with each other;
    a spacer structure, disposed on the substrate between each of the bit lines and each of the plugs;
    a plurality of storage node pads disposed on the plugs and the bit lines, wherein the storage node pads respectively contact the plugs;
    a plurality of capacitors disposed on the storage node pads to respectively in alignment with the storage node pads, each of the capacitors comprising a bottom electrode layer, a capacitor dielectric layer, and a top electrode layer stacked sequentially, wherein a bottommost surface of the capacitor dielectric layer is lower than a topmost surface of the storage node pads; and an insulating layer disposed on the bit lines, the plugs and the spacer structure, wherein a portion of the capacitor dielectric layer disposed on each of the bit lines surrounds a cavity, a portion of the insulating layer disposed on the bit lines surrounds the portion of the capacitor dielectric layer and the cavity, and a width of a bottom surface of the cavity is larger than a width of the bit lines.

13. The semiconductor memory device according to claim 12, wherein each of the bit lines comprises a semiconductor layer, a barrier layer and a metal layer stacked sequentially, and the insulating layer directly contacts the metal layer.

14. The semiconductor memory device according to claim 12, further comprising:
a protection layer disposed on each of the bit lines, between the insulating layer and the bit lines.

15. The semiconductor memory device according to claim 12, wherein the spacer structure comprises a first air gap layer, a first spacer and a second air gap layer, and the first air gap layer, the first spacer and the second air gap layer are sequentially stacked between sidewalls of the bit lines and the plugs.

16. A semiconductor memory device, comprising:
a substrate;
a plurality of bit lines separately disposed on the substrate;
a plurality of plugs disposed on the substrate, the plugs and the bit lines being alternately arranged with each other;
a spacer structure, disposed on the substrate between each of the bit lines and each of the plugs, wherein the spacer structure comprises a first air gap layer, a first spacer and a second air gap layer, and the first air gap layer, the first spacer and the second air gap layer are sequentially stacked between sidewalls of the bit lines and the plugs;
a plurality of storage node pads disposed on the plugs and the bit lines, wherein the storage node pads respectively contact the plugs, and the second air gap layer directly contacts the storage node pads;
a plurality of capacitors disposed on the storage node pads to respectively in alignment with the storage node pads, each of the capacitors comprising a bottom electrode layer, a capacitor dielectric layer, and a top electrode layer stacked sequentially, wherein a bottommost surface of the capacitor dielectric layer is lower than a topmost surface of the storage node pads.

17. The semiconductor memory device according to claim 16, further comprising:
an insulating layer disposed on the bit lines, the plugs and the spacer structure, wherein a portion of the insulating layer disposed on the bit lines surrounds a portion of the capacitor dielectric layer and a cavity.

18. The semiconductor memory device according to claim 17, further comprising:
a protection layer disposed on each of the bit lines, between the insulating layer and the bit lines.

19. The semiconductor memory device according to claim 16, wherein the spacer structure comprises a second spacer disposed between the sidewalls of the bit lines and the first air gap layer, and the second spacer does not directly contact the storage node pads.

20. The semiconductor memory device according to claim 19, wherein the second spacer and the first spacer comprises different material.

\* \* \* \* \*